United States Patent
Park

(10) Patent No.: US 10,528,465 B2
(45) Date of Patent: Jan. 7, 2020

(54) MEMORY SYSTEM AND OPERATING METHOD THEREOF

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/036,509

(22) Filed: Jul. 16, 2018

(65) Prior Publication Data

US 2019/0220394 A1 Jul. 18, 2019

(30) Foreign Application Priority Data

Jan. 12, 2018 (KR) .......................... 10-2018-0004388

(51) Int. Cl.
| | | |
|---|---|---|
| *G06F 12/00* | (2006.01) | |
| *G06F 12/02* | (2006.01) | |
| *G11C 29/00* | (2006.01) | |
| *G11C 16/34* | (2006.01) | |
| *G06F 3/06* | (2006.01) | |

(52) U.S. Cl.
CPC ........ *G06F 12/0246* (2013.01); *G06F 3/0679* (2013.01); *G11C 16/3495* (2013.01); *G11C 29/76* (2013.01)

(58) Field of Classification Search
CPC ............... G06F 3/0679; G06F 12/0246; G11C 16/3495; G11C 29/76

USPC ...................................................... 365/185.11
See application file for complete search history.

(56) References Cited

U.S. PATENT DOCUMENTS

| | | | | |
|---|---|---|---|---|
| 8,095,765 | B2* | 1/2012 | Asnaashari | ......... G06F 12/0246 711/170 |
| 8,312,245 | B2* | 11/2012 | Asnaashari | ......... G06F 12/0246 711/170 |
| 2010/0172180 | A1* | 7/2010 | Paley | ......... G06F 12/0246 365/185.12 |
| 2010/0228940 | A1* | 9/2010 | Asnaashari | ......... G06F 12/0246 711/170 |
| 2012/0124304 | A1* | 5/2012 | Asnaashari | ......... G06F 12/0246 711/159 |

FOREIGN PATENT DOCUMENTS

| | | |
|---|---|---|
| KR | 101327693 | 11/2013 |
| KR | 1020160042287 | 4/2016 |
| KR | 1020170073794 | 6/2017 |

* cited by examiner

*Primary Examiner* — Xiaochun L Chen

(74) *Attorney, Agent, or Firm* — IP & T Group LLP

(57) ABSTRACT

A memory system includes a memory device including a plurality of memory blocks, and a block management unit suitable for selecting a target super block and floating blocks from the memory blocks, matching blocks included in the target super block with the floating blocks, and changing the target super block to a super block.

29 Claims, 15 Drawing Sheets

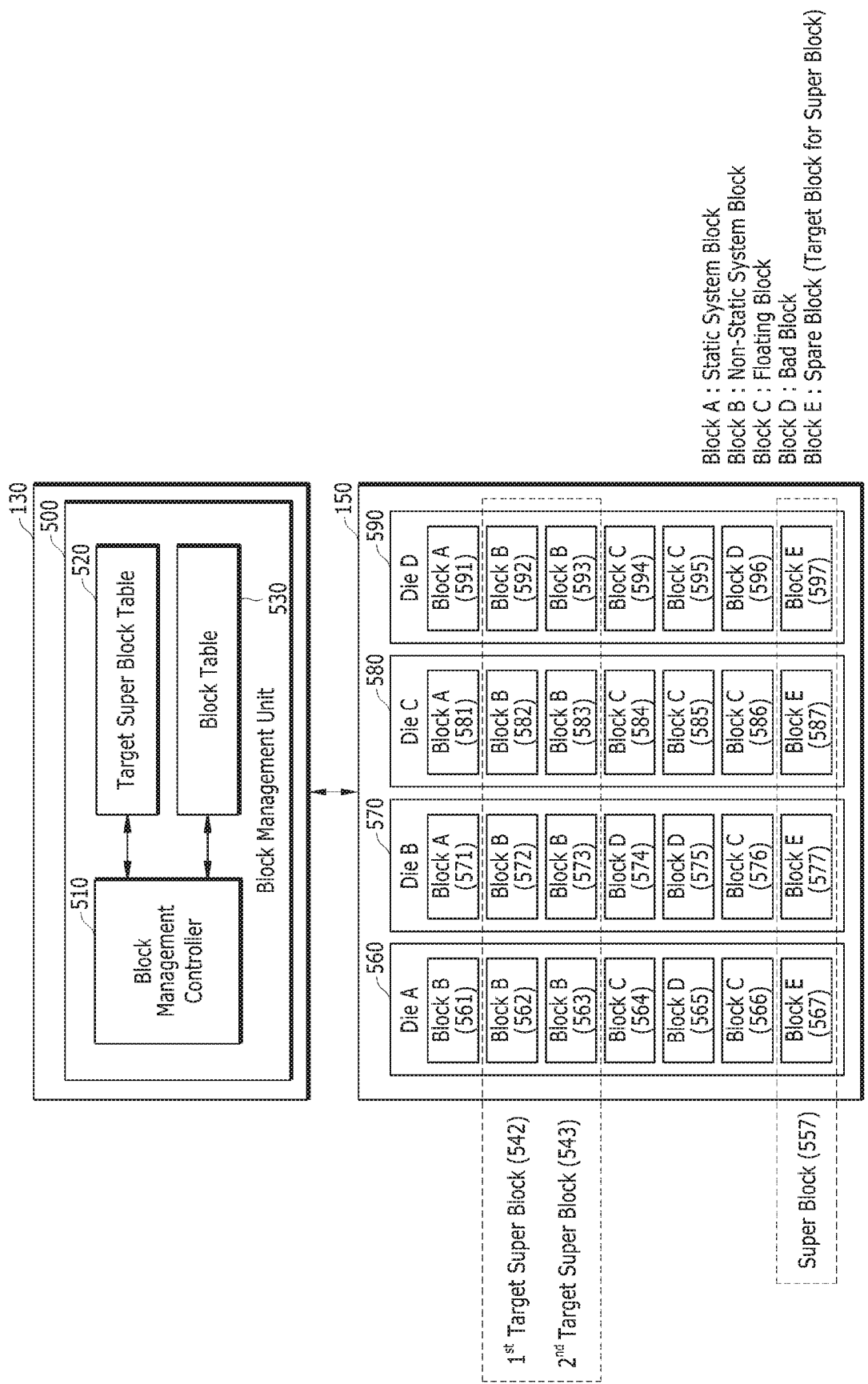

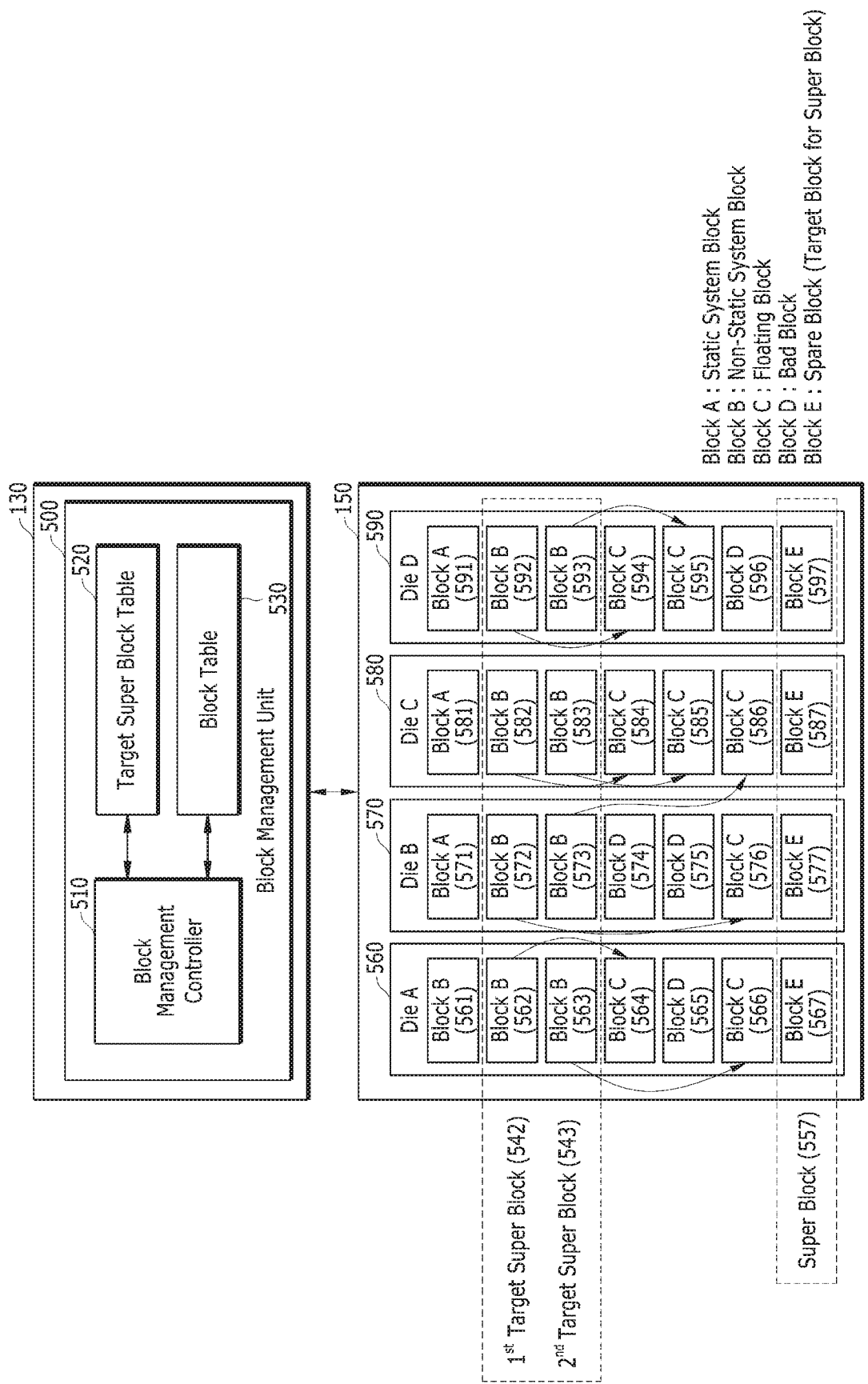

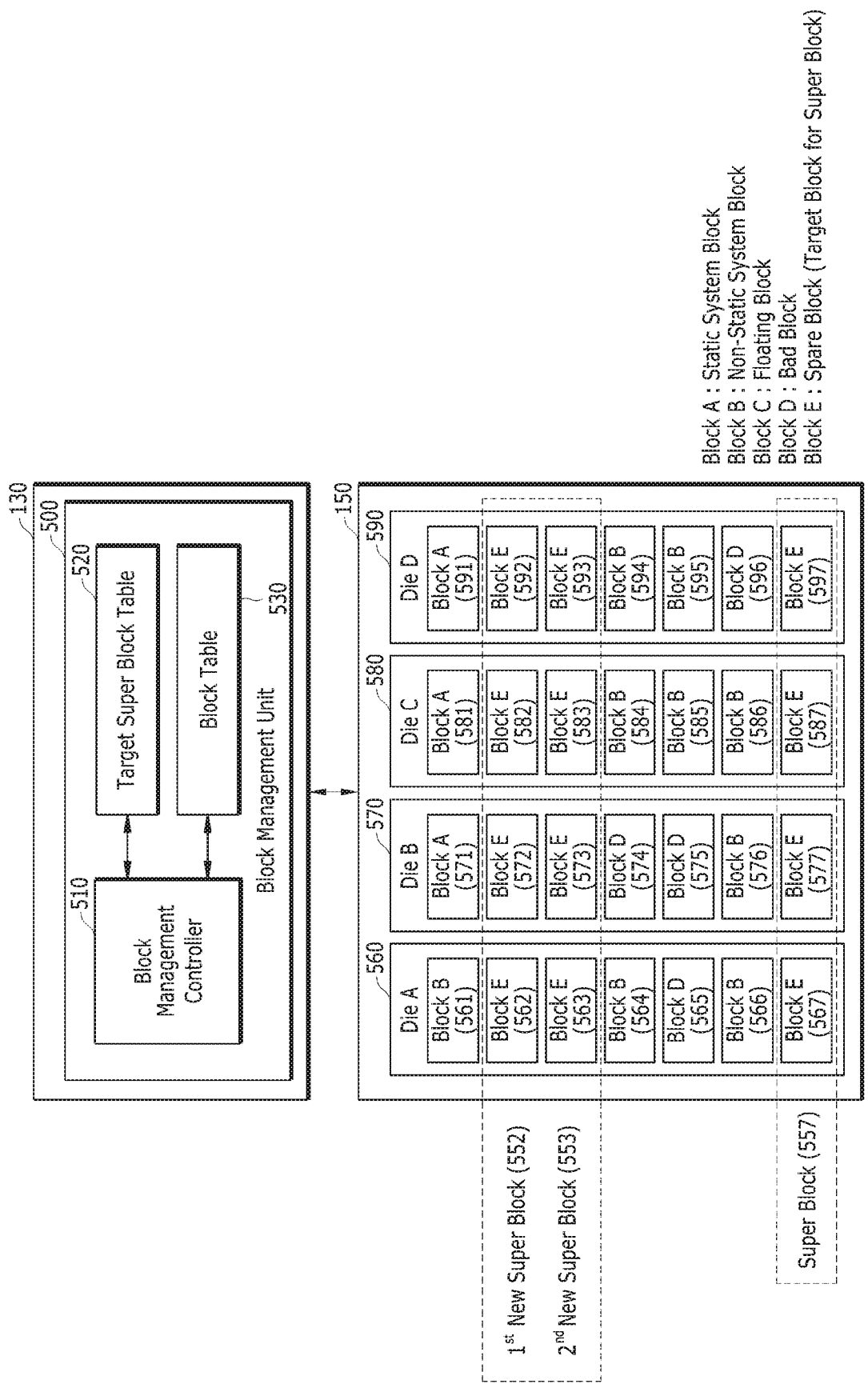

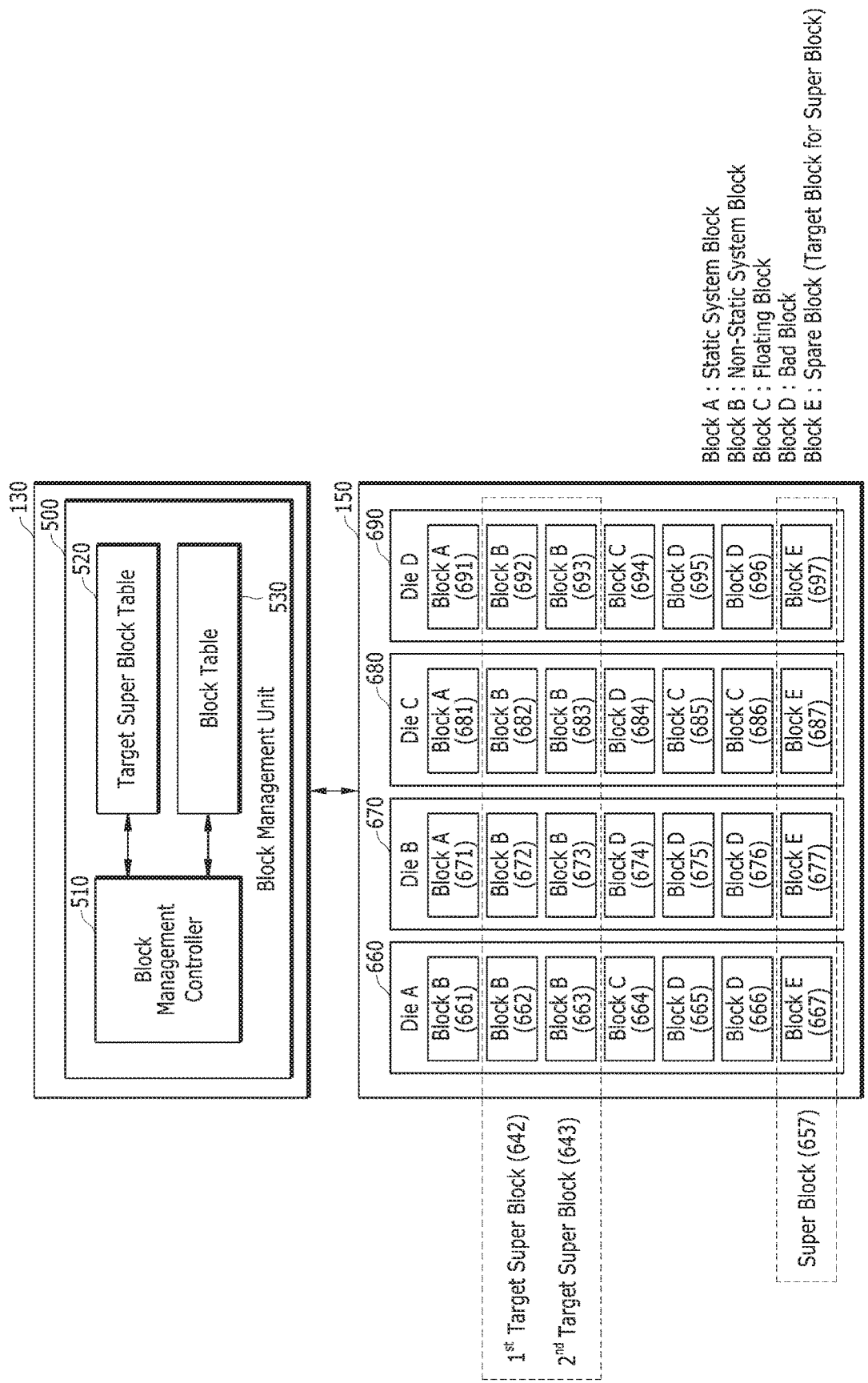

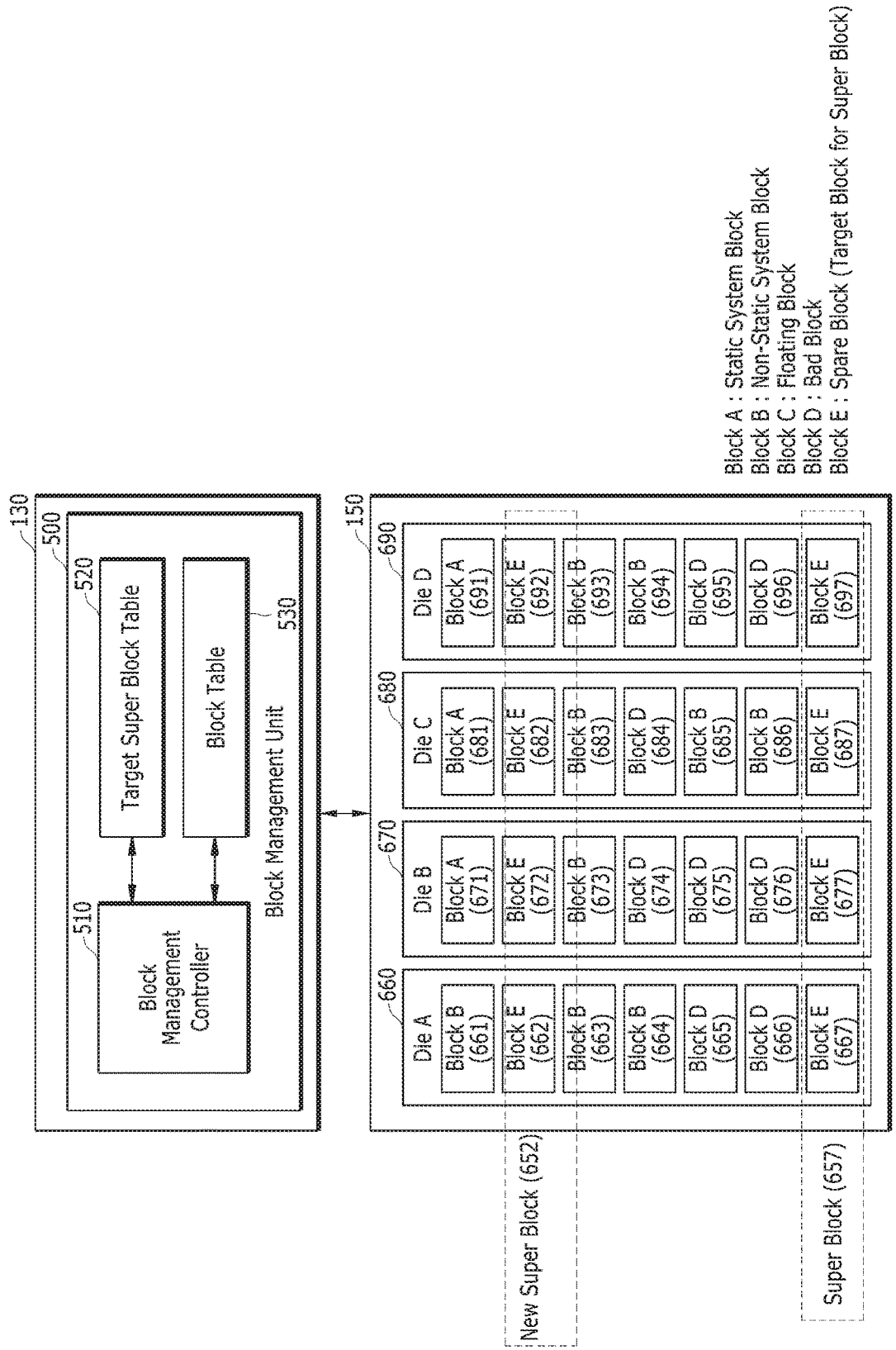

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2018-0004388, filed on Jan. 12, 2018, the disclosure of which is incorporated herein by reference in its entirety.

BACKGROUND

1. Field

Various exemplary embodiments of the present invention relate to a memory system and, more particularly, to a memory system capable of managing super blocks.

2. Description of the Related Art

The computer environment paradigm has changed to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

In terms of a system that manages a plurality of memory blocks included in a memory device, it is more advantageous to manage the memory blocks as super blocks than to manage the memory blocks individually.

Therefore, the number of floating blocks that cannot be configured as super blocks may be reduced, and the number of spare blocks that can be configured as super blocks may be increased. Consequently, there is a need for a method of increasing the number of super blocks.

SUMMARY

Various embodiments of the present invention are directed to a memory system capable of increasing the number of super blocks by reducing the number of floating blocks that cannot be configured as super blocks and increasing the number of spare blocks that can be configured as super blocks, and an operating method of the memory system.

In accordance with an embodiment of the present invention, a memory system includes: a memory device including a plurality of memory blocks; and a block management unit suitable for selecting a target super block and floating blocks from the memory blocks, matching blocks included in the target super block with the floating blocks, and changing the target super block to a super block.

The block management unit may include: a block management controller; a target super block table; and a block table.

The block management controller may select a plurality of target memory blocks that satisfy a condition of the target super block.

The target memory blocks satisfying the condition of the target super block may be non-static system blocks that meet an existing super block selection standard.

The block management controller may manage logical/physical addresses of the target memory blocks in the target super block table.

The block management controller may manage logical/physical addresses of the floating blocks, which serve a role as the target memory blocks, in the block table.

The block management controller may match the target memory blocks included in the target super block with the floating blocks based on the target super block table and the block table.

The block management controller may change a role of memory blocks from the floating blocks to the non-static system blocks based on a result of the matching, and manage the non-static system blocks included in the target super block as the super blocks.

In accordance with an embodiment of the present invention, an operating method for a memory system includes: selecting a target super block and floating blocks from a plurality of memory blocks included in a memory device through a block management unit; matching blocks included in the target super block with the floating blocks through the block management unit; and changing the target super block to a super block through the block management unit.

The block management unit may include: a block management controller; a target super block table; and a block table.

The block management controller may select a plurality of target memory blocks that satisfy a condition of the target super block.

The target memory blocks satisfying the condition of the target super block may be non-static system blocks that meet an existing super block selection standard.

The block management controller may manage logical/physical addresses of the target memory blocks in the target super block table.

The block management controller may manage logical/physical addresses of the floating blocks, which serves a role of the target memory blocks, in the block table.

The block management controller may match the target memory blocks included in the target super block with the floating blocks based on the target super block table and the block table.

The block management controller may change a role of memory blocks from the floating blocks to the non-static system blocks based on a result of the matching, and manage the non-static system blocks included in the target super block as the super blocks.

BRIEF DESCRIPTION OF THE DRAWINGS

FIGS. 5A to 5C are schematic diagrams illustrating exemplary configurations of a memory system in accordance with an embodiment of the present invention.

FIGS. 6A to 6C are schematic diagrams illustrating exemplary configurations of a memory system in accordance with an embodiment of the present invention.

DETAILED DESCRIPTION

Figure 1:
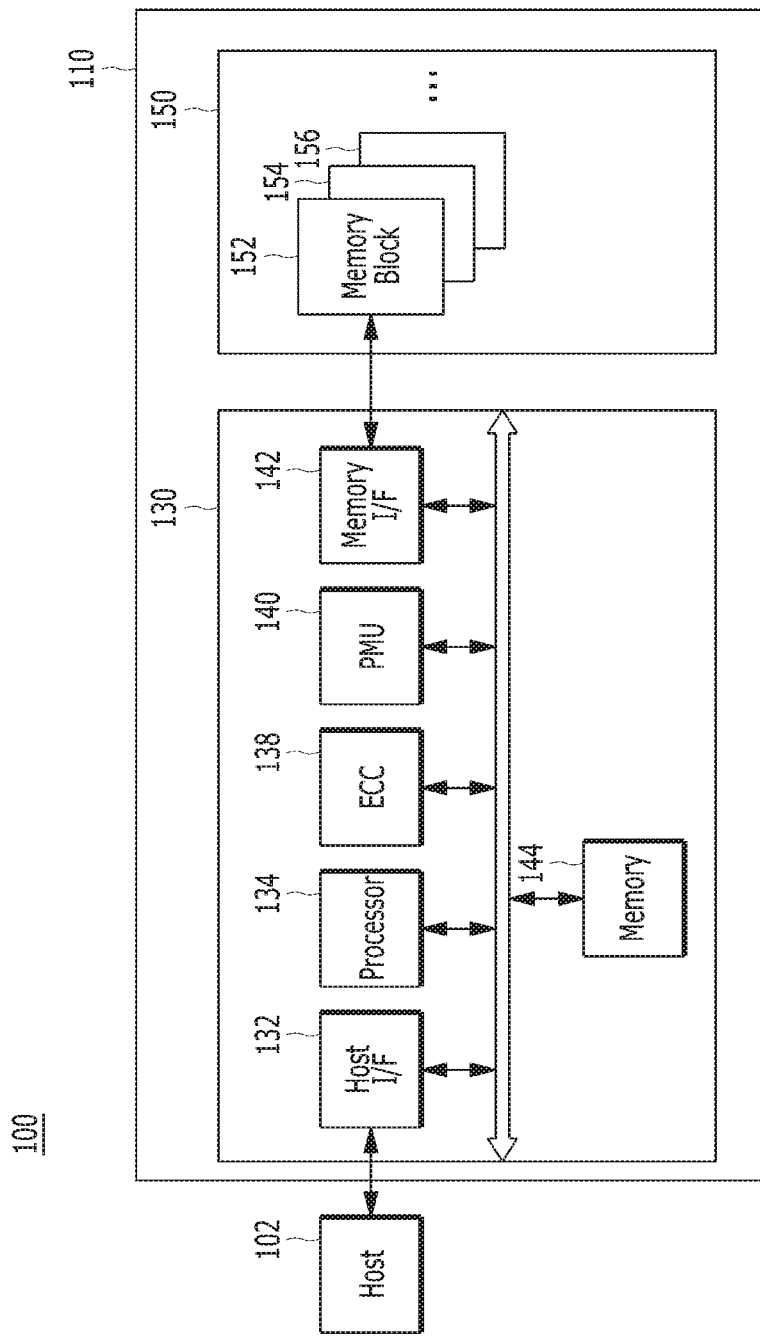
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as a mobile phone, MP3 player and laptop computer or non-portable electronic devices such as a desktop computer, game machine, TV and projector.

The host 102 may include at least one OS (operating system), and the OS may manage and control overall functions and operations of the host 102, and provide an operation between the host 102 and a user using the data processing system 100 or the memory system 110. The OS may support functions and operations corresponding to the purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and may execute an OS to perform an operation corresponding to a user's request on the memory system 110. Here, the host 102 may provide a plurality of commands corresponding to a user's request to the memory system 110, and thus the memory system 110 may perform certain operations corresponding to the plurality of commands, that corresponding to the user's request.

The memory system 110 may store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card and a memory stick. The MMC may include an embedded MMC (eMMC), reduced size MMC (RS-MMC) and micro-MMC. The SD card may include a mini-SD card and micro-SD card.

The memory system 110 may include various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In another example, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain stored data even though power is not supplied. The memory device 150 may store data provided from the host 102 through a write operation, and provide data stored therein to the host 102 through a read operation. In an embodiment, the memory device 150 may include a plurality of memory dies (not shown), each memory die may include a plurality of planes (not shown), each plane may include a plurality of memory blocks 152 to 156, each of the memory blocks 152 to 156 may include a plurality of pages, and each of the pages may include a plurality of memory cells coupled to a word line. In an embodiment, the memory device 150 may be a flash memory having a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

More specifically, the controller 130 may include a host interface (I/F) unit 132, a processor 134, an errorcorrection code (ECC) unit 138, a Power Management Unit (PMU) 140, a memory interface unit 142, and a memory 144 all operatively coupled via an internal bus.

The host interface unit 132 may process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface unit 132 may be driven via a firmware, that is, a host interface layer (HIL) for exchanging data with the host 102.

Further, the ECC unit 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The memory interface unit 142 may serve as a memory/storage interface for interfacing the controller 130 and the memory device 150 such that the controller 130 may control the memory device 150 in response to a request from the host 102. When the memory device 150 is a flash memory or specifically a NAND flash memory, the memory interface unit 142 may be NAND flash controller (NFC) and may generate a control signal for the memory device 150 and process data to be provided to the memory device 150 under the control of the processor 134. The memory interface unit 142 may work as an interface (e.g., a NAND flash interface) for processing a command and data between the controller 130 and the memory device 150. Specifically, the memory interface unit 142 may support data transfer between the controller 130 and the memory device 150. The memory interface unit 142 may be driven via a firmware, that is, a flash interface layer (FIL) for exchanging data with the memory device 150.

The memory 144 may serve as a working memory of the memory system 110 and the controller 130, and store data for driving the memory system 110 and the controller 130. The controller 130 may control the memory device 150 to perform read, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be a volatile memory however, a non-volatile memory may be used instead. For example, the memory 144 may be a static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be an external volatile memory having a memory interface transferring data between the memory 144 and the controller 130.

As described above, the memory 144 may include a program memory, a data memory, a write buffer/cache, a read buffer/cache, a data buffer/cache and a map buffer/cache to store data required to perform data write and read operations between the host 102 and the memory device 150, and data required for the controller 130 and the memory device 150 to perform these operations.

The processor 134 may control the overall operations of the memory system 110. The processor 134 may drive firmware to control the overall operations of the memory system 110. The firmware may be referred to as a flash translation layer (FTL).

For example, the controller 130 may perform an operation requested by the host 102 in the memory device 150 through the processor 134, which is implemented as a microprocessor, a CPU, or the like. In other words, the controller 130 may perform a command operation corresponding to a command received from the host 102. Herein, the controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is realized as a microprocessor or a CPU. Herein, the background operation performed on the memory device 150 may include an operation of copying and processing data stored in some memory blocks among the memory blocks 152 to 156 of the memory device 150 into other memory blocks, e.g., a garbage collection (GC) operation, an operation of performing swapping between the memory blocks 152 to 156 of the memory device 150 or between the data of the memory blocks 152 to 156, e.g., a wear-leveling (WL) operation, an operation of storing the map data stored in the controller 130 in the memory blocks 152 to 156 of the memory device 150, e.g., a map flush operation, or an operation of managing bad blocks of the memory device 150, e.g., a bad block management operation of detecting and processing bad blocks among the memory blocks 152 to 156 included in the memory device 150.

Also, in the memory system 110 in accordance with the embodiment of the present invention, the controller 130 may perform a plurality of command executions corresponding to a plurality of commands received from the host 102, e.g., a plurality of program operations corresponding to a plurality of write commands, a plurality of read operations corresponding to a plurality of read commands, and a plurality of erase operations corresponding to a plurality of erase commands, in the memory device 150. Also, the controller 130 may update meta-data, (particularly, map data) according to the command executions.

The processor 134 of the controller 130 may include a management unit (not illustrated) for performing a bad block management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, a bad block management operation performing with more reliability is needed. Hereafter, the memory device of the memory system in accordance with the embodiment of the present invention is described in detail with reference to FIGS. 2 to 4.

Figure 2:
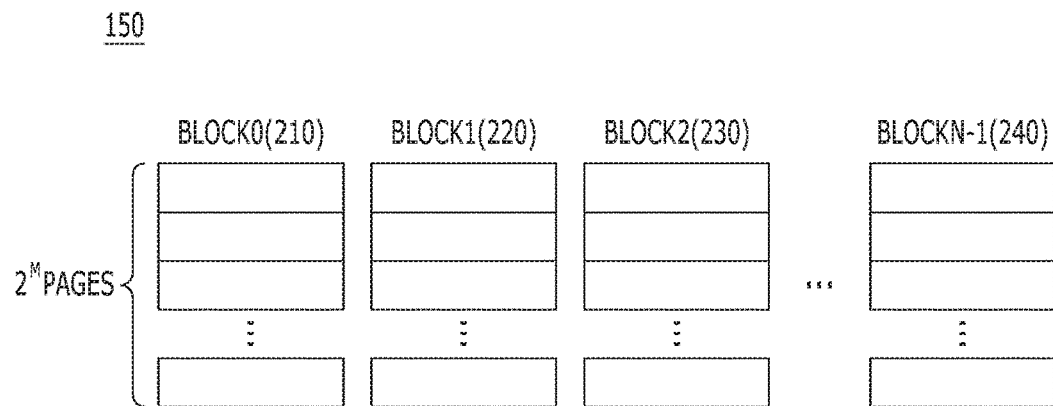
FIG. 2 is a schematic diagram illustrating an exemplary configuration of a memory device employed in a memory system of FIG. 1.

Referring to FIG. 2, the memory device 150 may include a plurality of memory blocks BLOCK0 to BLOCKN-1, where N is an integer greater than 1, and each of the blocks BLOCK0 to BL0CKN-1 may include a plurality of pages, for example, $2^M$ pages, where M is an integer greater than 0, the number of which may vary according to circuit design. Herein, although it is described that each of the memory blocks include $2^M$ pages, each of the memory blocks may include M pages as well. Each of the pages may include a plurality of memory cells that are coupled to a plurality of word lines WL.

Also, memory cells included in the respective memory blocks BLOCK0 to BLOCKN-1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells each storing one-bit data and may generally have high data computing performance and high durability. The MLC memory blocks may include a plurality of pages which are embodied by memory cells each storing multi-bit data (for example, 2 or more bits), and may generally have a larger data storage space than the SLC memory block, that is, higher integration density. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Although the embodiment of the present invention exemplarily describes that the memory device 150 may be the nonvolatile memory, it may implemented by any one of a phase change random access memory (PCRAM), a resistive random access memory (RRAM(ReRAM)), a ferroelectrics random access memory (FRAM), and a spin transfer torque magnetic random access memory (STT-RAM(STT-MRAM)).

The memory blocks 210, 220, 230 and 240 may store the data transferred from the host 102 through a program operation, and transfer data stored therein to the host 102 through a read operation.

Figure 3:
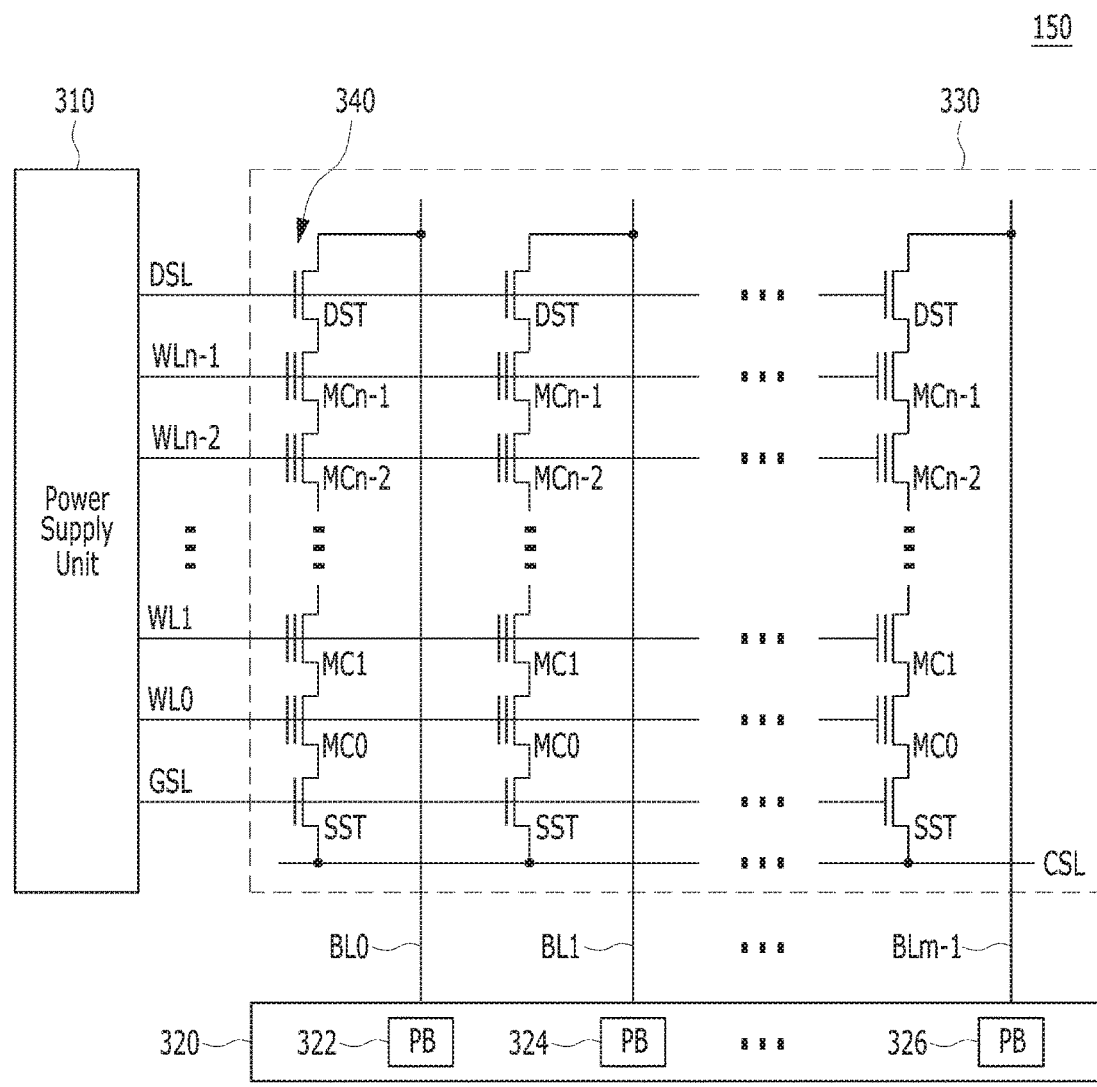
FIG. 3 is a circuit diagram illustrating an exemplary configuration of a memory cell array of a memory block in the memory device shown in FIG. 1.

Referring to FIG. 3, the memory block 330 may include a plurality of cell strings 340 coupled to a plurality of corresponding bit lines BL0 to BLm-1, where m is an integer greater than 1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage, and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
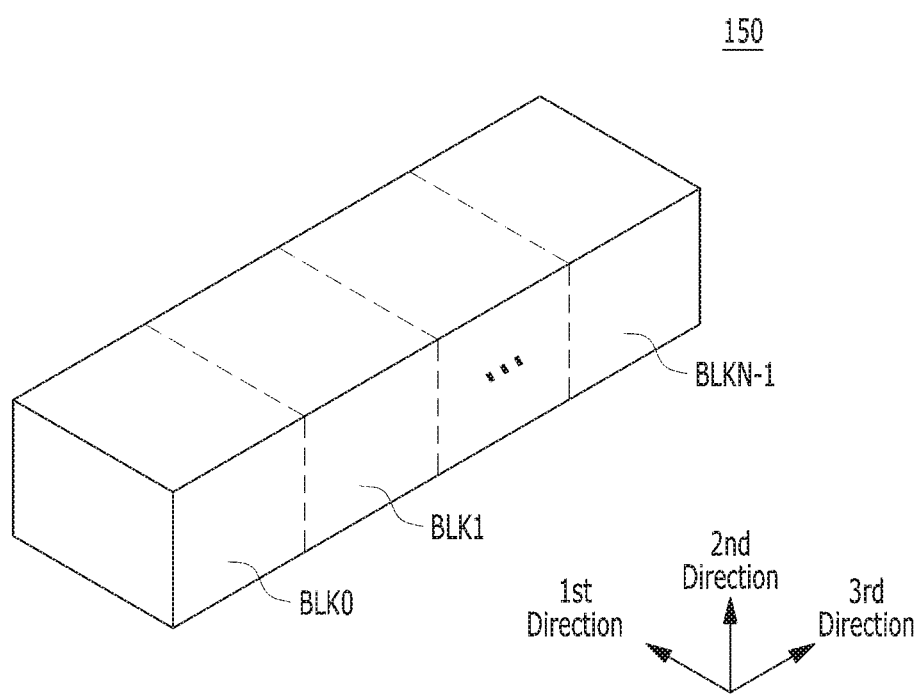
FIG. 4 is a block diagram illustrating an exemplary three-dimensional structure of the memory device shown in FIG. 2.

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

FIG. 5A shows a memory system including a block management unit 500 in accordance with an embodiment of the present invention.

The controller 130 may include the block management unit 500.

The block management unit 500 may include a block management controller 510, a target super block table 520, and a block table 530.

The block management unit 500 may select a target super block and a floating block from a plurality of memory blocks included in the memory device 150, match a block included in the target super block with the floating block, and change the target super block to a super block.

As shown in FIG. 5A, the memory device 150 may include a plurality of memory dies 560, 570, 580 and 590. Specifically, the memory device 150 may include a memory die A 560, a memory die B 570, a memory die C 580, and a memory die D 590.

Each of the memory dies 560, 570, 580 and 590 may include a plurality of memory blocks. Specifically, the memory die A 560 may include a plurality of memory blocks 561 to 567, the memory die B 570 may include a plurality of memory blocks 571 to 577, the memory die C 580 may include a plurality of memory blocks 581 to 587, and the memory die D 590 may include a plurality of memory blocks 591 to 597.

The plurality of memory blocks may be divided into a plurality of memory block groups (memory blocks A to E) depending on types and purposes of data stored therein.

For example, memory blocks A may be static system blocks, memory blocks B may be non-static system blocks, memory blocks C may be floating blocks, memory blocks D may be bad blocks, and memory blocks E may be target blocks for a super block 557.

The memory blocks A may be too inefficient system blocks to change the types and purposes of the data. For example, the memory blocks A may be booting blocks.

The memory blocks B may be system blocks that are easy to change the types and purposes of the data. For example, the memory blocks B may be package blocks.

The memory blocks C may be blocks that are difficult to form a super block due to a positional limit in the memory die, which are referred to as the floating blocks. According to the embodiment of the present invention, the memory blocks C may be used for the memory blocks B.

The memory blocks D may be the bad blocks having low reliability due to a high read count or the like.

The memory blocks E may satisfy a condition of being configured as the super block 557. Specifically, the memory blocks E may be spare blocks.

The block management unit 500 may manage the memory blocks included in the memory device 150 through the block management controller 510 to increase the number of super blocks. The block management unit 500 may change purposes of the memory blocks included in the memory device 150 so as to meet the condition of the super block 557 through the block management controller 510.

The condition of the super block 557 may be that the number of the memory blocks E disposed in the same row among the memory blocks included in the memory dies 560, 570, 580 and 590 is the same as the number of the memory dies 560, 570, 580 and 590.

However, the condition of the super block 557 is merely an example described simply for convenience in description. The memory blocks E may not be disposed in the physically same row, and may be disposed in the logically same row. Even though the number of the memory blocks E disposed in the same row is smaller than the number of the memory dies 560, 570, 580 and 590, the number of the memory blocks E which is equal to or higher than a predetermined value may be set to the condition of the super block 557.

The block management unit 500 may detect the memory blocks E 567, 577, 587 and 597 that satisfy the condition of the super block 557 as the super block 557.

A condition of target super blocks 542 and 543 may be that the number of the memory blocks B disposed in the same row among the memory blocks included in the memory dies 560, 570, 580 and 590 is the same as the number of the memory dies 560, 570, 580 and 590.

However, the condition of the target super blocks 542 and 543 is merely an example described simply for convenience in description. The memory blocks B may not be disposed in the physically same row, and may be disposed in the logically same row. Even though the number of the memory blocks B disposed in the same row is smaller than the number of the memory dies 560, 570, 580 and 590, the number of the memory blocks B which is equal to or higher than a predetermined value, for example, 3, may be set to the condition of the target super blocks 542 and 543.

The block management unit 500 may detect the memory blocks B 562, 572, 582 and 592 that satisfy the condition of the target super blocks 542 and 543 as a first target super block 542. In addition, the block management unit 500 may detect the memory blocks B 563, 573, 583 and 593 that satisfy the condition of the target super blocks 542 and 543 as a second target super block 543.

The block management controller 510 may store and manage information on the target super blocks 542 and 543 in the target super block table 520.

The information on the target super blocks 542 and 543 may be information on locations of the target super blocks 542 and 543 such as a logical address and a physical address.

The block management controller 510 may detect the memory blocks C, which are the floating blocks, among the blocks included in the memory device 150 and manage information on the memory blocks C through the block table 530.

The memory blocks C may be the blocks that are difficult to form the super block due to the positional limit in the memory die. For example, the memory block C 564, the memory block D 574, the memory block C 584 and the memory block C 594 are disposed in different memory dies simultaneously while being disposed in the same row. However, since the memory block D 574 is the bad block, the memory blocks 564, 574, 584 and 594 may not be grouped into the super block. Therefore, the memory blocks C 564, 584 and 594, which are not grouped into the super block due to the memory block D 574, may be referred to as the floating blocks.

In this manner, the block management unit 500 may dynamically manage the target super blocks and the floating blocks among the blocks included in the memory device 150 through the block management controller 510. In addition, the block management controller 510 may store and manage the information on the target super blocks and information on the floating blocks in the target super block table 520 and the block table 530, respectively.

FIG. 5B shows a process of the block management unit 500 changing the purposes of the memory blocks.

The block management controller 510 may obtain logical/physical address information of the memory blocks B 562, 563, 572, 573, 582, 583, 592 and 593 included in the target super blocks 542 and 543 through the target super block table 520.

Furthermore, the block management controller 510 may obtain logical/physical address information of the memory blocks C 564, 566, 576, 584, 585, 586, 594 and 595 through the block table 530.

The block management controller 510 may match the memory blocks B 562, 563, 572, 573, 582, 583, 592 and 593 included in the target super blocks 542 and 543 with the memory blocks C 564, 566, 576, 584, 585, 586, 594 and 595, respectively.

The block management controller 510 may change the purposes of the respective memory blocks based on a result of the matching. For example, the memory block B 562 may be used as the system block previously. However, according to the matching of the block management controller 510, the memory block B 562 may be the spare block and a target block of the first target super block 542.

The block management controller 510 may change the purposes of the respective memory blocks through a firmware. Specifically, the block management controller 510 may exchange data stored in the memory blocks B 562, 563, 572, 573, 582, 583, 592 and 593 included in the target super blocks 542 and 543 and data stored in the memory blocks C 564, 566, 576, 584, 585, 586, 594 and 595. The block management controller 510 may designate purposes of the memory blocks B 562, 563, 572, 573, 582, 583, 592 and 593 included in the target super blocks 542 and 543 as the spare blocks and purposes of the memory blocks C 564, 566, 576, 584, 585, 586, 594 and 595 as the non-static system blocks corresponding to the memory blocks B through the firmware.

FIG. 5C shows a result of the block management unit 500 changing the purposes of the memory blocks.

Since the memory blocks E 562, 572, 582 and 592 are disposed as the spare blocks in different dies and the same row, a new super block 552 may be formed, and since the memory blocks E 563, 573, 583 and 593 are disposed as the spare blocks in different dies and the same row, a new super block 553 may be formed.

The block management controller 510 may set the memory blocks E 562, 572, 582 and 592 to the new super block 552 and the memory blocks E 563, 573, 583 and 593 to the new super block 553 to manage together with the super block 557.

FIG. 6A shows a memory system including a block management unit 500 in accordance with an embodiment of the present invention.

In FIG. 6A, the number of memory blocks B which are non-static system blocks is greater than the number of memory blocks C which are floating blocks.

When the number of memory blocks B is greater than the number of memory blocks C, a block management controller 510 may match the memory blocks B with the memory blocks C in a manner to maximally secure a new super block.

As shown in FIG. 6A, the memory device 150 may include a plurality of memory dies 660, 670, 680 and 690. Specifically, the memory device 150 may include a memory die A 660, a memory die B 670, a memory die C 680, and a memory die D 690.

Each of the memory dies 660, 670, 680 and 690 may include a plurality of memory blocks. Specifically, the memory die A 660 may include a plurality of memory blocks 661 to 667, the memory die B 670 may include a plurality of memory blocks 671 to 677, the memory die C 680 may include a plurality of memory blocks 681 to 687, and the memory die D 690 may include a plurality of memory blocks 691 to 697.

The block management unit 500 may manage the memory blocks included in the memory device 150 through the block management controller 510 to increase the number of super blocks. The block management unit 500 may change purposes of the memory blocks included in the memory device 150 to meet a condition of a super block 657 through the block management controller 510.

The condition of the super block 657 may be that the number of memory blocks E disposed in the same row among the memory blocks included in the memory dies 660, 670, 680 and 690 is the same as the number of the 660, 670, 680 and 690.

The block management unit 500 may detect the memory blocks E 667, 677, 687 and 697 that satisfy the condition of the super block 657 as the super block 657.

A condition of target super blocks 642 and 643 may be that the number of the memory blocks B disposed in the same row among the memory blocks included in the memory dies 660, 670, 680 and 690 is the same as the number of the memory dies 660, 670, 680 and 690.

The block management unit 500 may detect the memory blocks B 662, 672, 682 and 692 that satisfy the condition of the target super blocks 642 and 643 as a first target super block 642. In addition, the block management unit 500 may detect the memory blocks B 663, 673, 683 and 693 that satisfy the condition of the target super blocks 642 and 643 as a second target super block 643.

The block management controller 510 may store and manage information on the target super blocks 642 and 643 in a target super block table 520.

The information on the target super blocks 642 and 643 may be information on locations of the target super blocks 642 and 643 such as a logical address and a physical address.

The block management controller 510 may detect the memory blocks C, which are the floating blocks, among the blocks included in the memory device 150 and manage information on the memory blocks C through a block table 530.

The memory blocks C may be the blocks that are difficult to form the super block due to a positional limit in the memory die. For example, the memory block C 664, the memory block D 674, the memory block D 684 and the memory block C 694 are disposed in different memory dies simultaneously while being disposed in the same row. However, since the memory blocks D 674 and 684 are bad blocks, the memory blocks 664, 674, 684 and 694 may not be grouped into the super block. Therefore, the memory blocks C 664 and 694, which are not grouped into the super block due to the memory blocks D 674 and 684, may be referred to as the floating blocks.

In this manner, the block management unit 500 may dynamically manage the target super blocks and the floating blocks among the blocks included in the memory device 150 through the block management controller 510. In addition, the block management controller 510 may store and manage the information on the target super blocks and information on the floating blocks in the target super block table 520 and the block table 530, respectively.

Figure 6B:
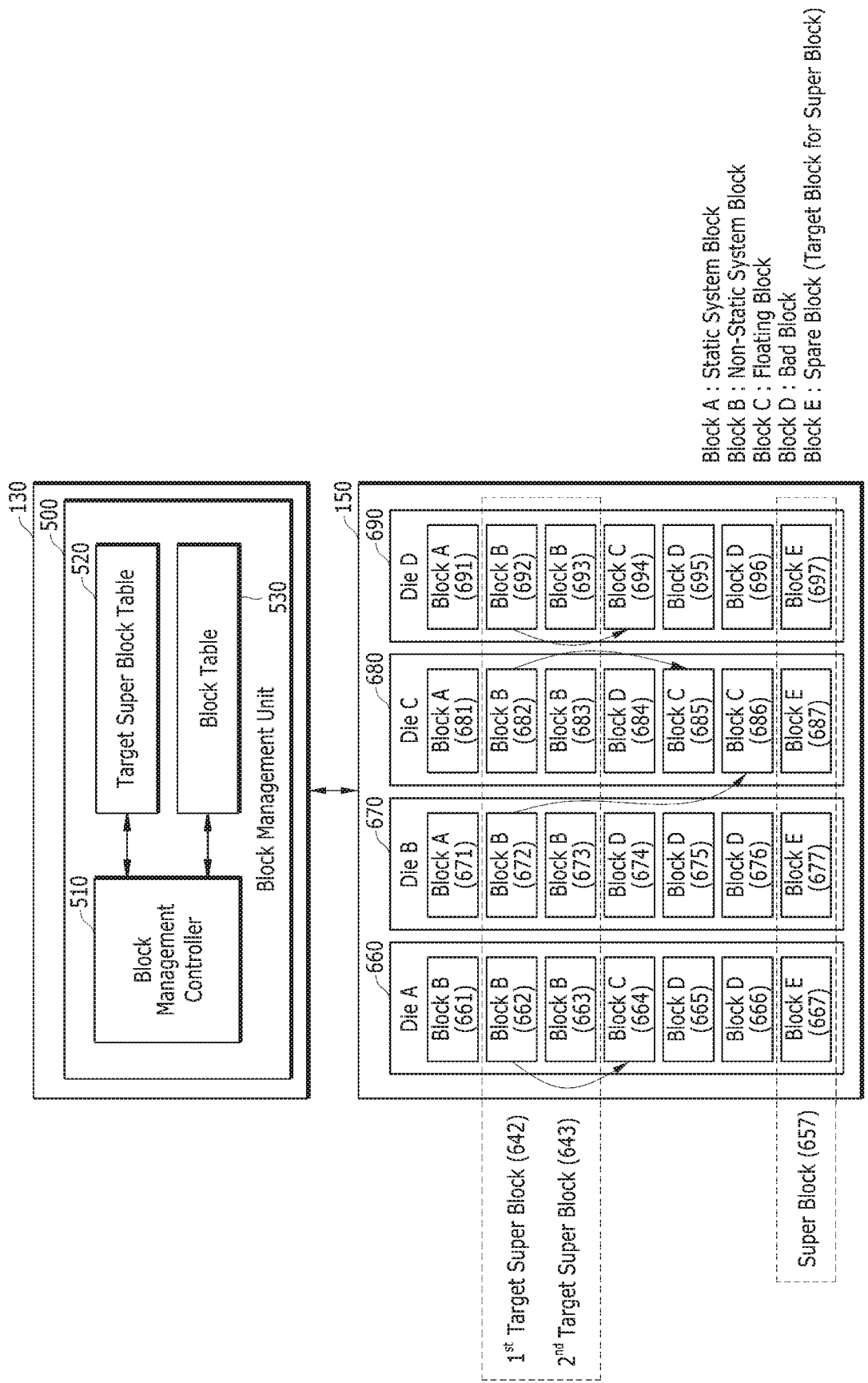

FIG. 6B shows a process of the block management unit 500 changing the purposes of the memory blocks.

The block management controller 510 may obtain logical/physical address information of the memory blocks B 662, 663, 672, 673, 682, 683, 692 and 693 included in the target super blocks 642 and 643 through the target super block table 520.

Furthermore, the block management controller 510 may obtain logical/physical address information of the memory blocks C 664, 685, 686 and 694 through the block table 530.

The block management controller 510 may match the memory blocks C 664, 685, 686 and 694 with some memory blocks B among the memory blocks B 662, 663, 672, 673, 682, 683, 692 and 693 included in the target super blocks 642 and 643.

The block management controller 510 may match the memory blocks C with the memory blocks B in a manner to maximally secure the new super block.

As shown in FIG. 6B, the block management controller 510 may match the memory bloc B 662 with the memory block C 664, the memory block B 672 with the memory block C 686, the memory block B 682 with the memory block C 685, and the memory block B 692 with the memory block C 694.

In other words, when the number of the memory blocks B is greater than the number of the memory blocks C, the block management controller 510 may preferentially match the memory blocks B 662, 672, 682 and 692 included in the first target super block 642 with the memory blocks C. When some memory blocks B 662 and 672 included in the first target super block 642 and some memory blocks B 663 and 673 included in the second target super block 643 are matched with the memory blocks C, a condition for forming the new super block may not be satisfied, and thus the block management controller 510 may fail to generate the new super block.

Accordingly, the block management controller 510 may match the memory blocks B with the memory blocks C in a best manner of meeting the condition for forming the new super block.

FIG. 6C shows a result of the block management unit 500 changing the purposes of the memory blocks.

Since the memory blocks E 662, 672, 682 and 692 are disposed as the spare blocks in different dies and the same row, a new super block 652 may be formed.

The block management controller 510 may set the memory blocks E 662, 672, 682 and 692 to the new super block 652 to manage together with the super block 657.

Figure 7:
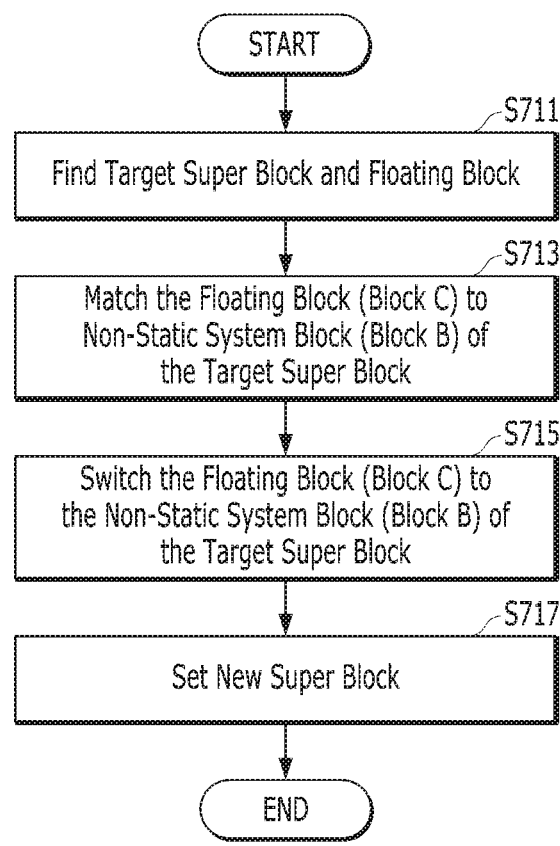
FIG. 7 is a flowchart illustrating an operation of a memory system in accordance with an embodiment of the present invention.

FIG. 7 is a flowchart illustrating an operating method of the block management unit 500 in accordance with an embodiment of the present invention.

In step S711, the block management unit 500 may select a target super block and a floating block from the plurality of memory blocks included in the memory device 150.

Specifically, the block management unit 500 may dynamically manage the target super block and the floating block among the blocks included in the memory device 150 through the block management controller 510. In addition, the block management controller 510 may store and manage the information on the target super block and the information on the floating block in the target super block table 520 and the block table 530, respectively.

The block management controller 510 may obtain the logical/physical address information of the memory blocks B included in the target super block through the target super block table 520.

The block management controller 510 may obtain the logical/physical address information of the memory blocks C through the block table 530.

In step S713, the block management controller 510 may match the memory blocks B included in the target super block with the memory blocks C. When the number of the memory blocks B is greater than the number of the memory blocks C, the block management controller 510 may match the memory blocks B with the memory blocks C in a manner to maximally secure a new super block.

In step S715, the block management controller 510 may change purposes of the respective memory blocks based on a result of the matching.

For example, the memory blocks B may be used as the system blocks previously. However, according to the matching of the block management controller 510, the memory blocks B may be spare blocks and target blocks for the target super block.

The block management controller 510 may change the purposes of the respective memory blocks through a firmware.

Specifically, the block management controller 510 may exchange data stored in the memory blocks B included in the target super block and data stored in the memory blocks C. The block management controller 510 may designate purposes of the memory blocks B included in the target super block as the spare blocks and purposes of the memory blocks C as non-static system blocks corresponding to the memory blocks B through the firmware.

In step S717, the block management controller 510 may set the memory blocks B, which are changed to the memory blocks E, to a new super block to manage together with an existing super block.

Hereafter, various data processing systems and electronic devices to which the memory system 110 including the memory device 150 and the controller 130, as described above with reference to FIGS. 1 to 7, in accordance with the embodiment of the present disclosure will be described in detail with reference to FIGS. 8 to 16.

Figure 8:
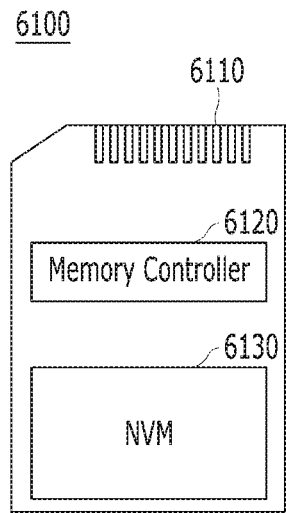
FIGS. 8 to 16 are diagrams schematically illustrating application examples of the data processing system, in accordance with various embodiments of the present invention.

FIG. 8 is a diagram schematically illustrating another example of the data processing system including the memory system in accordance with the present embodiment. FIG. 8 schematically illustrates a memory card system to which the memory system in accordance with the present embodiment is applied.

Referring to FIG. 8, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processing unit, a host interface, a memory interface and an error correction unit.

The memory controller 6120 may communicate with an external device, for example, the host 102 of FIG. 1 through the connector 6110.

For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (SII-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 9:
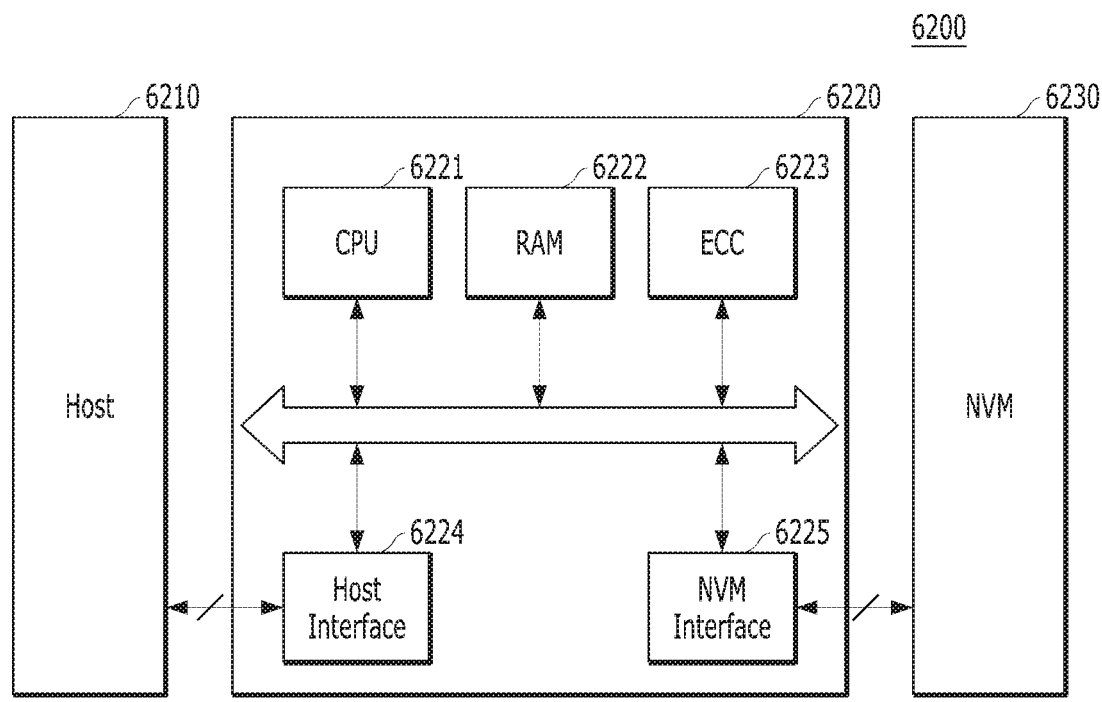

FIG. 9 is a diagram schematically illustrating another example of the data processing system including the memory system in accordance with the present embodiment.

Referring to FIG. 9, the data processing system 6200 may include a memory device 6230 having one or more nonvolatile memories and a memory controller 6220 for controlling the memory device 6230. The data processing system 6200 illustrated in FIG. 9 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request from the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations for the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device

6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit.

For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 10:
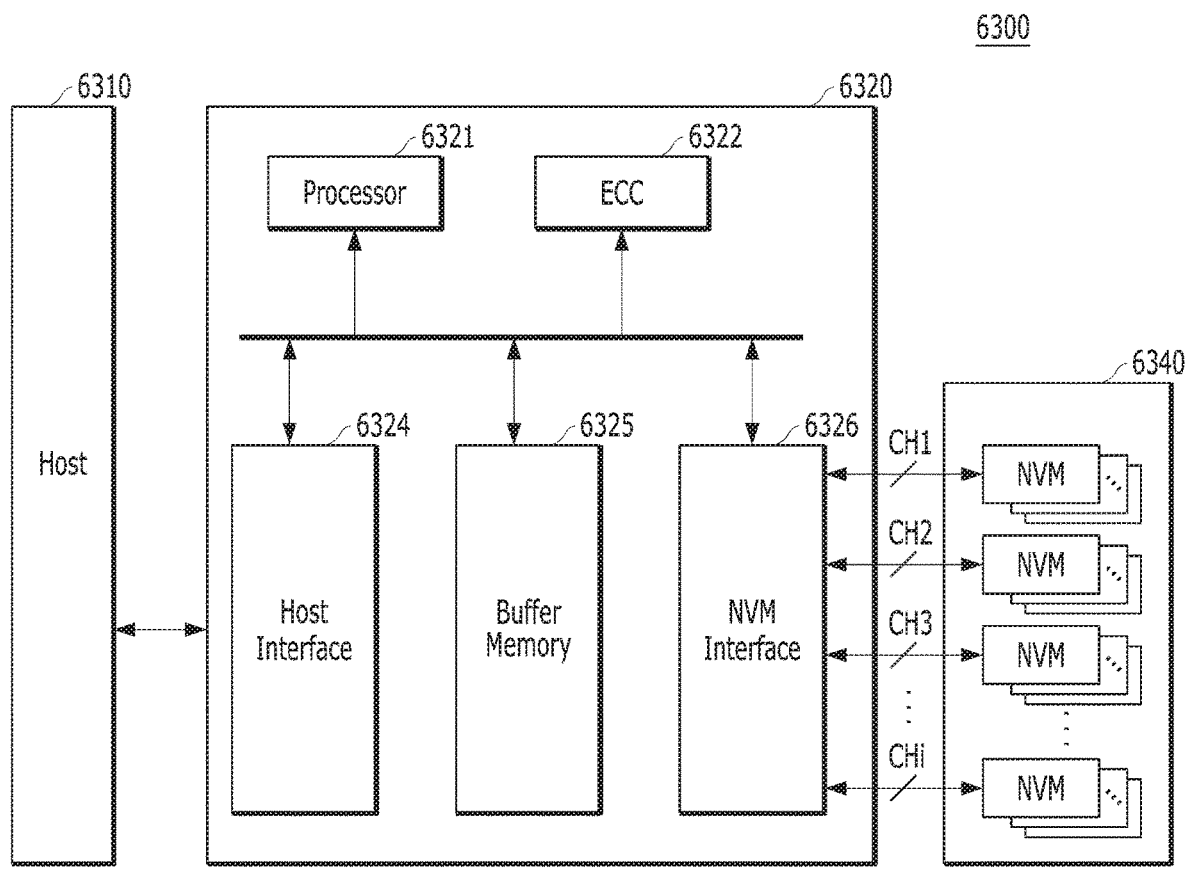

FIG. 10 is a diagram schematically illustrating another example of the data processing system including the memory system in accordance with the present embodiment. FIG. 10 schematically illustrates an SSD to which the memory system in accordance with the present embodiment is applied.

Referring to FIG. 10, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
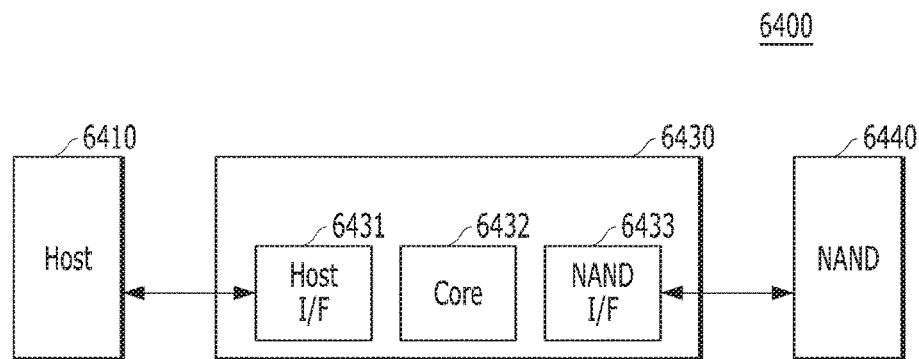

FIG. 11 is a diagram schematically illustrating another example of the data processing system including the memory system in accordance with the present embodiment. FIG. 11 schematically illustrates an embedded Multi-Media Card (eMMC) to which the memory system in accordance with the present embodiment is applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 12 to 15 are diagrams schematically illustrating other examples of the data processing system including the memory system in accordance with the present embodiment.

FIGS. 12 to 15 schematically illustrate UFS (Universal Flash Storage) systems to which the memory system in accordance with the present embodiment is applied.

Referring to FIGS. 12 to 15, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 8.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 12:
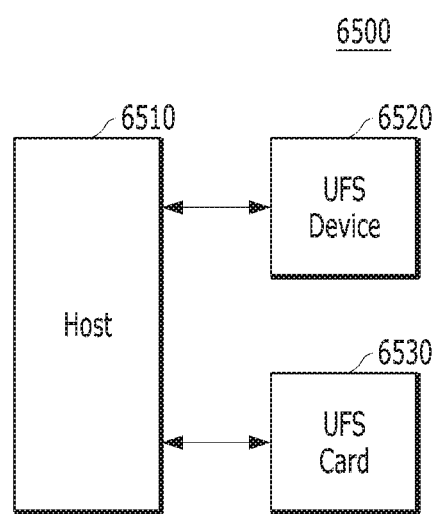

In the UFS system 6500 illustrated in FIG. 12, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 13:
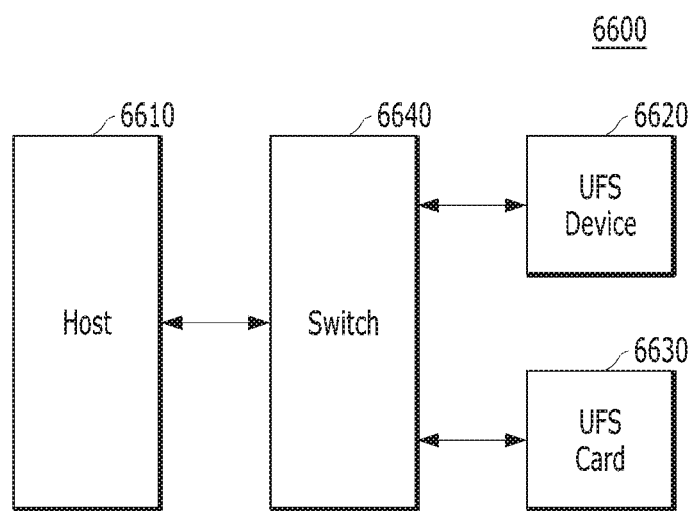

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
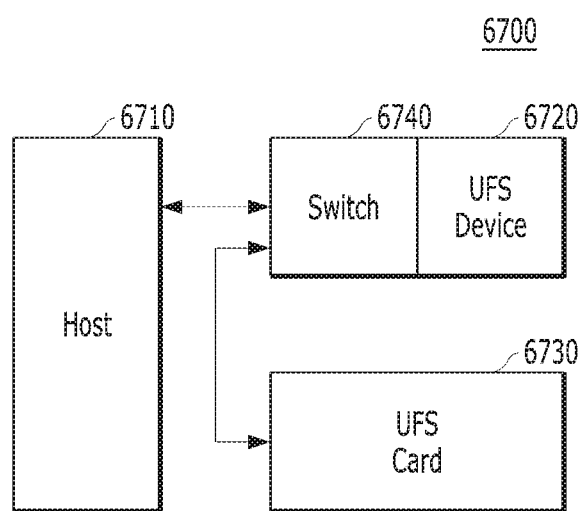

In the UFS system 6700 illustrated in FIG. 14, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
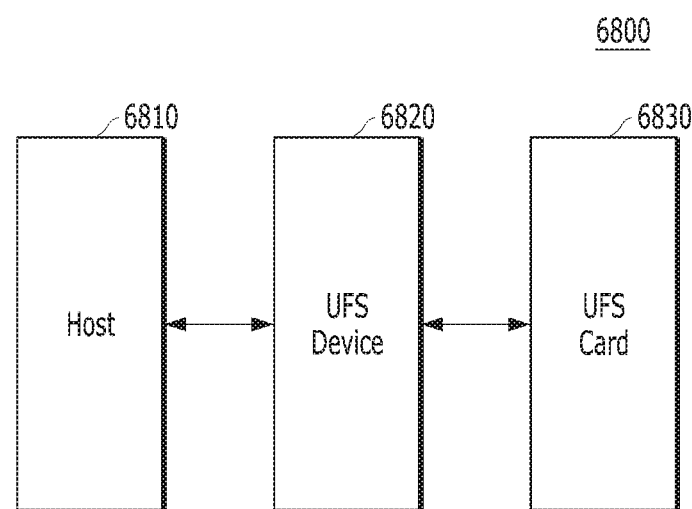

In the UFS system 6800 illustrated in FIG. 15, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
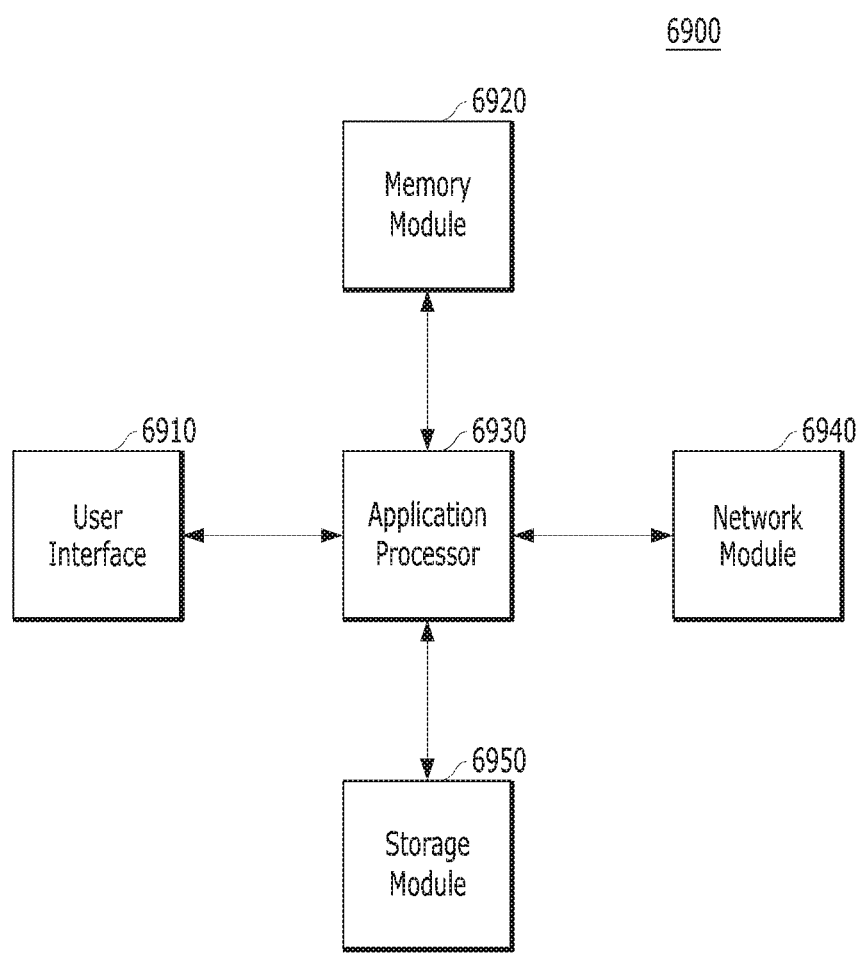

FIG. 16 is a diagram schematically illustrating another example of the data processing system including the memory system in accordance with an embodiment of the present invention. FIG. 16 is a diagram schematically illustrating a user system to which the memory system in accordance with the present embodiment is applied.

Referring to FIG. 16, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with embodiments of the present invention, the number of floating blocks that cannot be grouped into super blocks may be reduced, and the number of the super blocks may be increased.

While the present invention has been described with respect to specific embodiments, it will be apparent to those skilled in the art that various changes and modifications may be made without departing from the spirit and scope of the invention as defined in the following claims.

What is claimed is:

1. A memory system, comprising:
a memory device including a memory array; and
a block management unit suitable for:
swapping system memory blocks included in a system block group with floating blocks disposed in a same row as one or more bad blocks after a replacement of other bad blocks with spare blocks, and
managing the system block group, after the swapping, as a super block.

2. The memory system of claim 1, wherein the block management unit includes:
a block management controller;
a target super block table; and
a block table.

3. The memory system of claim 2, wherein the block management controller selects the system blocks based on an existing super block selection standard.

4. The memory system of claim 2, wherein the block management controller manages logical/physical addresses of the system memory blocks in the target super block table.

5. The memory system of claim 4, wherein the block management controller manages logical/physical addresses of the floating blocks, which serve a role as the system memory blocks, in the block table.

6. The memory system of claim 5, wherein the block management controller matches the system memory blocks included in the system block group with the floating blocks based on the target super block table and the block table.

7. The memory system of claim 6, wherein the block management controller changes a role of memory blocks from the floating blocks to the system memory blocks based on a result of the matching.

8. An operating method for a memory system, comprising:
swapping system memory blocks included in a system block group with the floating blocks disposed in a same row with one or more bad blocks after a replacement of other bad blocks with spare blocks; and
managing the system block group, after the swapping, as a super block.

9. The operating method of claim 8, further comprising selecting the system blocks based on an existing super block selection standard.

10. The operating method of claim 8, further comprising managing logical/physical addresses of the system memory blocks in a target super block table.

11. The operating method of claim 10, further comprising managing logical/physical addresses of the floating blocks, which serve a role as the system memory blocks, in a block table.

12. The operating method of claim 11, wherein in the swapping of the system memory blocks included in the system block group with the floating blocks, the system memory blocks included in the system block group are matched with the floating blocks based on the target super block table and the block table.

13. The operating method of claim 12, wherein in the swapping of the system memory blocks included in the system block group with the floating blocks, a role of memory blocks is changed from the floating blocks to the system memory blocks based on a result of the matching.

14. A memory system, comprising:
a memory device including a memory block array, which includes first and second memory blocks storing system data and user data, respectively; and
a block management unit suitable for:
exchanging the system data stored in selected memory blocks among the first memory blocks with the user data stored in the second memory blocks, which are disposed in a same row as one or more bad blocks; and
configuring a super block, after the exchanging, with the selected memory blocks.

15. The memory system of claim 14, wherein the block management unit is further suitable for selecting the memory blocks satisfying a predetermined condition among the first memory blocks, and
wherein the block management unit includes first and second tables storing information of the first and second memory blocks, respectively.

16. The memory system of claim 15, wherein the predetermined condition is satisfied if the selected memory blocks are physically disposed in a same row and included in different memory dies.

17. The memory system of claim 15, wherein the predetermined condition is satisfied if the selected memory blocks are logically disposed in a same row and a number of the selected memory blocks is a predetermined value or greater.

18. The memory system of claim 15, wherein the information of the first memory blocks includes logical/physical addresses of the selected memory blocks among the first memory blocks.

19. The memory system of claim 15, wherein the information of the second memory blocks includes logical/physical addresses of the second memory blocks.

20. The memory system of claim 15, wherein the block management unit exchanges the system data stored in the selected memory blocks with the user data stored in the second blocks based on the first and second tables.

21. The memory system of claim 20, wherein the block management unit changes a role of the second memory blocks from storing the user data to storing the system data based on a result of the exchanging.

22. An operating method for a memory system, comprising:
exchanging system data stored in selected memory blocks among first memory blocks with user data stored in second memory blocks, which are disposed in a same row as one or more bad blocks; and
configuring a super block, after the exchanging, with the selected memory blocks.

23. The operating method of claim 22, further comprising:
selecting the memory blocks satisfying a predetermined condition among the first memory blocks; and
managing information of the first and second memory blocks included in first and second tables, respectively.

24. The operating method of claim 23, wherein the predetermined condition is satisfied if the selected memory blocks are physically disposed in a same row and included in different memory dies.

25. The operating method of claim 23, wherein the predetermined condition is satisfied if the selected memory blocks are logically disposed in a same row and a number of the selected memory blocks is a predetermined value or greater.

26. The operating method of claim 23, wherein the information of the first memory blocks includes logical/physical addresses of the selected memory blocks among the first memory blocks.

27. The operating method of claim 23, wherein the information of the second memory blocks includes logical/physical addresses of the second memory blocks.

28. The operating method of claim 23, wherein the exchanging of the system data stored in the selected memory blocks among the first memory blocks with the user data stored in the second memory blocks includes exchanging the system data stored in the selected memory blocks with the user data stored in the second memory blocks based on the first and second tables.

29. The operating method of claim 28, further comprising changing a role of the second memory blocks from storing the user data to storing the system data based on a result of the exchanging.

* * * * *